United States Patent [19]

Nagasaka

[11] Patent Number: 4,594,310
[45] Date of Patent: Jun. 10, 1986

[54] PHOTOPOLYMERIZABLE COMPOSITION COMPRISING TERTIARY AROMATIC AMINE AND HEXAARYLBIIMAZOLE INITIATORS

[75] Inventor: Hideki Nagasaka, Yamato, Japan

[73] Assignee: Mitsubishi Chemical Industries, Ltd., Tokyo, Japan

[21] Appl. No.: 660,088

[22] Filed: Oct. 12, 1984

[30] Foreign Application Priority Data

Oct. 14, 1983 [JP] Japan ................. 58-192212

[51] Int. Cl.$^4$ .................. G03C 1/68; C08F 2/46; C08F 8/18
[52] U.S. Cl. ................... 430/281; 430/916; 430/920; 522/26
[58] Field of Search ........... 430/281, 916, 920, 926; 204/159.18, 159.23

[56] References Cited

U.S. PATENT DOCUMENTS

| | | | |
|---|---|---|---|
| 3,479,185 | 11/1969 | Chambers, Jr. | 430/916 |
| 3,782,951 | 1/1974 | Lee | 430/920 |
| 3,844,790 | 10/1974 | Chang et al. | 430/920 |
| 4,282,309 | 8/1981 | Laridon et al. | 430/920 |
| 4,311,783 | 1/1982 | Dessauet | 430/920 |
| 4,346,162 | 8/1982 | Abele et al. | 430/920 |
| 4,410,621 | 10/1983 | Wada et al. | 430/920 |
| 4,459,349 | 7/1984 | Tanaka et al. | 430/920 |

Primary Examiner—Richard L. Schilling

Attorney, Agent, or Firm—Oblon, Fisher, Spivak, McClelland & Maier

[57] ABSTRACT

A photopolymerizable composition comprising an addition-polymerizable compound having at least one ethylenically unsaturated double bond and a photopolymerization initiator, characterized in that the initiator comprises (a) a compound of the formula:

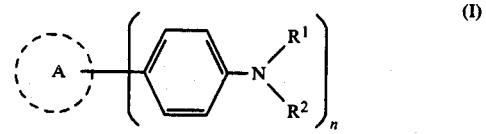

wherein $R^1$ and $R^2$ are alkyl group, n is 1, 2 or 3 and ring A is an aromatic ring containing nitrogen atom, and (b) hexaarylbiimidazole. The initiator may additionally contain a thiol of the formula:

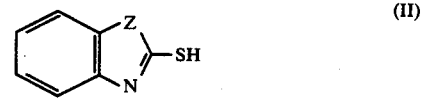

wherein Z is —O—, —S— or —NH—. The composition is not only highly sensitive to ultraviolet ray but also highly stable in storage.

5 Claims, No Drawings

PHOTOPOLYMERIZABLE COMPOSITION COMPRISING TERTIARY AROMATIC AMINE AND HEXAARYLBIIMAZOLE INITIATORS

BACKGROUND OF THE INVENTION

1. Field of the Invention

This invention relates to a photopolymerizable composition, particularly to the photopolymerizable composition highly sensitive to ultraviolet rays and highly stable in storage.

2. Discussion of the Background

Not a few processes for image formation by the use of a photopolymerizable composition have been known. One of those is a process for forming a relief image in which the photopolymerizable composition is prepared by combining an addition-polymerizable compound having ethylenically unsaturated double bond and a photopolymerization initiator optionally together with organic polymer binder, thermal polymerization inhibitor, coloring agent and plasticizer, the photopolymerizable composition thus obtained is applied onto the surface of a substrate with or without solvent to form a photosensitive plate provided with a layer of the photopolymerizable composition, and the photosensitive plate is then exposed through any original image to polymerize and cure the exposed areas while removing the unexposed areas by development. In another process, the photopolymerizable composition is sandwiched between two substrates, at least one of which is transparent, to form the photosensitive plate as mentioned above, and the image formation is realized after imagewise exposing on the surface of the transparent substrate followed by peeling off the same substrate, by which imagewise exposure the adhesive strength of the photopolymerizable composition is differentiated between the exposed and unexposed areas. Besides, other process of the image formation in which the toner-attracting activity of the photopolymerizable composition is changed by the exposing light is known as well.

In the foregoing processes for image formation, benzoin, benzoin alkyl ether, benzophenone, anthraquinone, benzil, Michler's ketone, etc. were conventionally employed as the photopolymerization initiator to be incorporated into those photopolymerizable composition. The sensitivity of such initiators was, however, not necessarily sufficient, and accordingly many researches had been directed to improve the sensitivity of the initiator. Thereafter, a combined initiator comprising two or more active compounds was found to considerably enhance the sensitivity. For instance, the combination of benzophenone and Michler's ketone is a typical example thereof (British Patent Specification No. 1,090,142). Various studies are still in progress to achieve further higher sensitivity, and are being reported in the literatures. In many cases, however, improved sensitivity has been found to be usually accompanied with poor stability in storage, and therefore no initiator with both higher sensitivity and higher stability in storage has yet been provided up to now.

SUMMARY OF THE INVENTION

It is an object of the present invention to provide a novel photopolymerization initiator with such high sensitivity and stability. Another object of the invention is to provide a photopolymerizable composition incorporating the initiator herein described. Other objects of the invention will be apparent from the following descriptions.

The photopolymerizable composition according to the present invention comprises an addition-polymerizable compound having at least one ethylenically unsaturated double bond and a photopolymerization initiator, characterized in that the initiator comprises;

(a) a compound represented by the general formula:

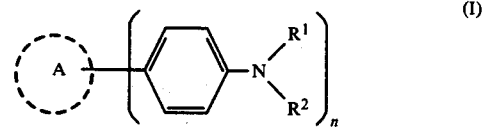

wherein $R^1$ and $R^2$ are an alkyl group, respectively, n is an integer of 1, 2 or 3 and ring A is an aromatic ring containing a nitrogen atom, and (b) hexaarylbiimidazole.

DETAILED DESCRIPTION OF THE PREFERRED EMBODIMENTS

The addition-polymerizable compound having at least one ethylenically unsaturated double bond, the first essential component of the present composition, hereinafter referred to as "compound with ethylenically unsaturated double bond" in short, may be either a monomer having ethylenically unsaturated double bond or a polymer having ethylenically unsaturated double bond in a side or main chain thereof. They can undergo the addition polymerization to become hard and substantially insoluble by the action of a photodecomposed product of the initiator, the second essential component of the present composition, which is generated by the irradiation of actinic light to the photopolymerizable composition.

The compound with ethylenically unsaturated double bond as defined herein includes, for instance, unsaturated carboxylic acid, ester of unsaturated carboxylic acid with aliphatic polyhydroxy compound, ester of unsaturated carboxylic acid with aromatic polyhydroxy compound and ester obtained by the esterification reaction among unsaturated carboxylic acid, polycarboxylic acid and the above described aromatic or aliphatic polyhydroxy compound.

By way of illustrating the ester of the unsaturated carboxylic acid and the aliphatic polyhydroxy compound, mention may be made of acrylate such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentaerythritol hexacrylate and glycerol acrylate; methacrylate such as triethylene glycol dimethacrylate, trimethylolpropane trimethacrylate, trimethylolethane trimethacrylate, pentaerythritol dimethacrylate, pentaerythritol trimethacrylate, pentaerythritol tetramethacrylate, dipentaerythritol dimethacrylate, dipentaerythritol trimethacrylate and dipentaerythritol tetramethacrylate; itaconates, crotonate and malate of aliphatic polyhydroxy compound and the like.

By way of illustrating the ester of the unsaturated carboxylic acid and the aromatic polyhydroxy compound, mention may be made of hydroquinone diacrylate, hydroquinone dimethacrylate, resorcine diacrylate, resorcine dimethacrylate, pyrogallol triacrylate and the like.

The ester obtained by the esterification reaction among the unsaturated carboxylic acid, polycarboxylic acid and polyhydroxy compound is not necessarily a single substance, but typical examples thereof are the condensation product of acrylic acid, phthalic acid and ethylene glycol, the condensation product of acrylic acid, maleic acid and diethylene glycol, the condensation product of methacrylic acid, terephthalic acid and pentaerythritol, and the condensation product of acrylic acid, adipic acid, butanediol and glycerin.

Other examples of the compound with ethylenically unsaturated double bond are acrylamides such as ethylene bisacrylamide, allyl esters such as diallyl phthalate and compounds having vinyl group such as divinyl phthalate, etc.

The polymer having the ethylenically unsaturated double bond in the main chain thereof includes, for instance, a polyester obtained by the condensation polymerization of unsaturated dibasic carboxylic acid with dihydroxy compound, a polyamide obtained by the condensation polymerization of unsaturated dibasic carboxylic acid with diamine. The polymer having the ethylenically unsaturated double bond in the side chain thereof includes, for instance, a condensation polymer of dibasic carboxylic acid having the ethylenically unsaturated double bond in the side chain thereof, e.g., itaconic acid, propylidene succinic acid and ethylidene malonic acid, with dihydroxy or diamine compound. In addition, polymers obtained by the reaction of polymer having reactive functional groups such as hydroxy group or halogenated methyl group in the side chain thereof, for instance, polyvinyl alcohol, poly(2-hydroxyethylmethacrylate) or polyepichlorohydrin with the unsaturated carboxylic acid such as (meth)acrylic acid or crotonic acid, are suitable as the first essential component as well.

Among those compounds with ethylenically unsaturated double bond mentioned above, monomers of acrylate and methacrylate are particularly preferable.

According to the present invention, the photopolymerization initiator, the second essential component of the photopolymerizable composition, is defined to be those which can generate free radicals upon receiving the actinic radiation and proceed the addition polymerization of the compound with ethylenically unsaturated double bond. The initiator comprises at least two ingredients, the compound (a) represented by the formula (I) and the compound (b). The compound (a) has the chemical structure that the aromatic ring containing nitrogen atom, as represented by the symbol A, for instance, oxazole, thiazole, imidazole, pyridine, pyrimidine or a condensed ring thereof with an aromatic hydrocarbon ring such as benzene and naphthalene, or oxadiazole, thiadiazole, triazole, s-triazine, etc. is directly bound with 1 to 3 p-dialkylaminophenyl groups.

The alkyl groups, $R^1$ and $R^2$, of the compound (a) are preferably methyl or ethyl group. By way of illustrating the compound (a), mention may be made of 2-(p-dimethylaminophenyl)benzoxazole (referred as to "compound a-1" hereinafter), 2-(p-diethylaminophenyl)benzoxazole (referred as to "compound a-2" hereinafter), 2-(p-dimethylaminophenyl)benzo[4,5]benzoxazole (referred as to "compound a-3" hereinafter), 2-(p-dimethylaminophenyl)benzo[6,7]benzoxazole (referred as to "compound a-4" hereinafter), 2,5-bis(p-dimethylaminophenyl)-1,3,4-oxadiazole (referred as to "compound a-5" hereinafter), 2-(p-dimethylaminophenyl)benzothiazole (referred as to "compound a-6" hereinafter), 2-(p-diethylaminophenyl)benzothiazole (referred as to "compound a-7" hereinafter), 2-(p-dimethylaminophenyl)benzimidazole (referred as to "compound a-8" hereinafter), 2,5-bis(p-dimethylaminophenyl)-1,3,4-thiadiazole, 2-(p-dimethylaminophenyl) pyridine, 2-(p-dimethylaminophenyl)quinoline, 2-(p-dimethylaminophenyl)pyrimidine, 2,4,6-tris(p-dimethylaminophenyl)-s-triazine and 2-(p-dimethylaminophenyl)-1,3,4-triazole.

The followings are the chemical structures of compounds a-1 to a-8, respectively.

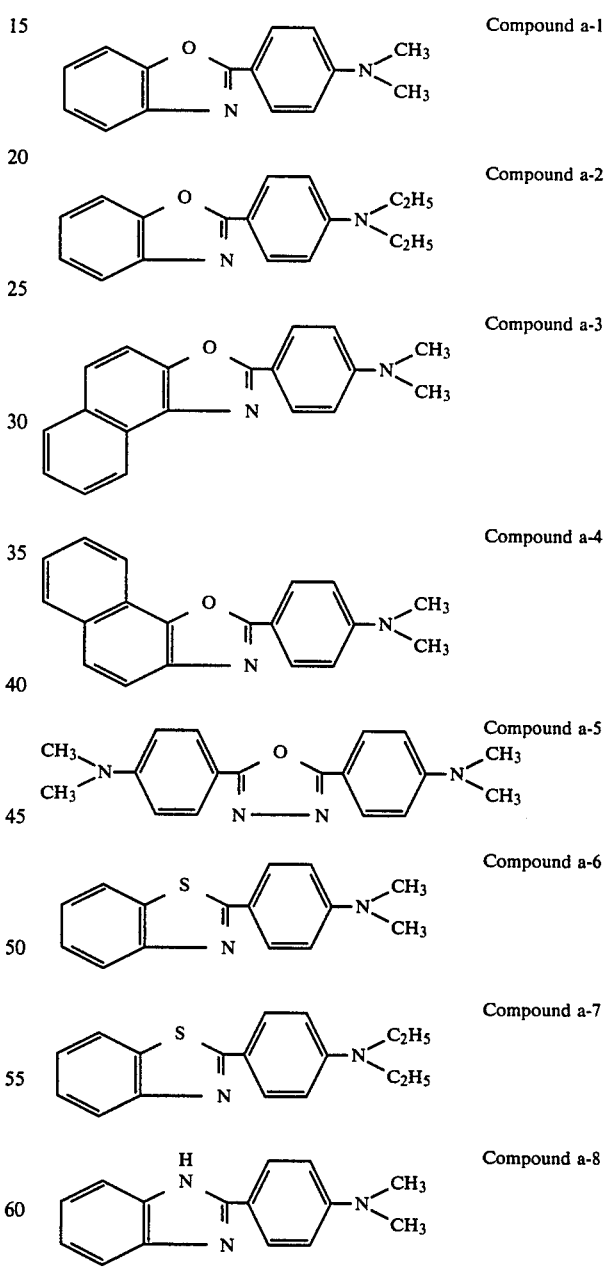

Among those described above, the compound (a) of which aromatic ring containing nitrogen atom is benzoxazole, benzo[4,5]-benzoxazole and oxadiazole is particularly preferable. Compounds a-1 to a-8 may be prepared in accordance with the method disclosed in Zh.

Obshch. Kim., 32, 2617 (1962) or British Patent Specification No. 746,047.

The second ingredient of the compound (b) is hexaarylbiimidazole. That is, it is a 2,4,5-triarylimidazolyl dimer and has the following chemical structure in which two imidazoles are bound through one covalent bond,

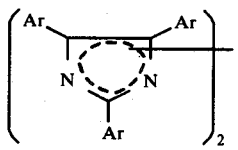

wherein Ar is an aryl group.

Various isomers of the above compound (b) may be useful as well in this invention.

As the aryl group, a substituted or nonsubstituted phenyl group is preferable. Hexaphenylbiimidazole in which the phenyl groups in 2 and 2' positions thereof are substituted in their ortho position with halogen such as fluorine, chlorine or bromine atom, nitro group or methyl group is particularly preferable in view of the thermal stability and the photoreaction rate.

By way of illustrating the hexaarylbiimidazole, mention may be made of 2,2'-bis(o-chlorophenyl)-4,4',5,5'-tetraphenylbiimidazole (referred as to "compound b-1" hereinafter), 2,2'-bis(o-bromophenyl)-4,4',5,5'-tetraphenylbiimidazole (referred as to "compound b-2" hereinafter), 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole and 2,2'-bis(o-methylphenyl)-4,4',5,5'-tetraphenylbiimidazole.

These hexaarylbiimidazoles may be prepared in accordance with the method described in Bull. Chem. Soc. Japan, 33, 565 (1960) and J. Org. Chem., 36[16], 2262 (1971) without difficulty.

As described in the foregoings, the photopolymerization initiator according to the invention is mainly based on the combination of two compounds (a) and (b) and has an excellent sensitivity to the actinic light or to the rays in the ultraviolet region.

In this invention, a thiol compound represented by the following formula:

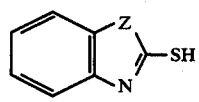 (II)

wherein Z is —O—, —S— or —NH—, is advantageously combined into the initiator as the third ingredient. By additionally combining this thiol, the higher and improved sensitivity may be attained. By way of illustrating the thiol, mention may be made of 2-mercaptobenzothiazole (referred as to "compound c-1" hereinafter), 2-mercaptobenzoxazole (referred as to "compound c-2" hereinafter) and 2-mercaptobenzimidazole (referred as to "compound c-3" hereinafter).

Each ingredient of the initiator cooperates effectively to one another to form the excellent photopolymerization initiator. With respect to the proportions of these ingredients in the present composition, the compound (a) is incorporated thereinto in an amount of 0.1 to 15%, preferably 1 to 10% by weight of the compound with ethylenically unsaturated double bond, the compound (b) is in an amount of 0.5 to 30%, preferably 2 to 15% by weight of the compound with ethylenically unsaturated double bond and the compound (c) is, if incorporated, in an amount of 0.1 to 20%, preferably 1 to 15% by weight of the compound with ethylenically unsaturated double bond.

In addition to the first and second essential components of the invention, according to the present invention, an organic polymer may be added thereto as a binder to modify the property of the composition or to improve the properties of the composition after hardening by light. The binder to be added is appropriately selected by taking into consideration the purpose of said addition, for instance, enhancement of compatibility, film-formation, development and adhesion. Indicatively, for improving the aqueous development, added is a copolymer of (meth)acrylic acid, a copolymer of itaconic acid, a copolymer of partially esterified maleic acid, a modified acidic cellulose with carboxylic groups in the side chain thereof, polyethylene oxide or polyvinyl pyrrolidone. For improving the film-formation and strength of adhesion, exemplified are the following binders: polyether of epichlorohydrine and bis-phenol A, soluble nylon, polyalkyl methacrylate such as polymethyl methacrylate, polyalkyl acrylate, a copolymer of alkyl methacrylate with acrylonitrile, acrylic acid, methacrylic acid, vinyl chloride, vinylidene chloride or styrene, a copolymer of acrylonitrile with vinyl chloride or vinylidene chloride, polyvinylidene chloride, chlorinated polyolefin, a copolymer of vinyl chloride with vinyl acetate, polyvinyl acetate, a copolymer of acrylonitrile with styrene, a copolymer of acrylonitrile with butadiene or styrene, polyvinyl alkyl ether, polyvinyl alkyl ketone, polystylene, polyamide, polyurethane, polyethylene terephthalate isophthalate, acetyl cellulose and polyvinylbutyral. The proportion of the binder in the composition is in the range of less than 500% by weight, preferable less than 200% by weight of the compound with ethylenically unsaturated double bond.

Furthermore, the composition according to the invention may contain, if desired, thermal polymerization inhibitor, coloring agent, plasticizer, surface protector, lubricant and coating auxiliary.

As the thermal polymerization inhibitor, hydroquinone, p-methoxyphenol, pyrogallol, catechol, 2,6-di-t-butyl-p-cresol and β-naphtol are exemplified. As the coloring agent, phthalocyanine pigments, azo pigments, other pigments such as carbon black and titanium oxide, triphenylmethane dyes such as ethyl violet and crystal violet, azo dyes, anthraquinone dyes and cyanine dyes are exemplified. The proportion of the thermal polymerization inhibitor is in the range of 0.01 to 3% by weight of the combination amount of the compound with ethylenically unsaturated double bond and the binder, and on the other hand, the proportion of the coloring agent is in the range of 0.1 to 20% by weight of the combination amount. As the plasticizer, exemplified are dioctyl phthalate, didodecyl phthalate, triethylene glycol dicaprylate, dimethyl glycol phthalate, tricresyl phosphate, dioctyl adipate, dibutyl sebacate, glycerol triacetate, and its proportion is in the range of not more than 5% by weight of the combination amount mentioned above.

The photopolymerizable composition of the invention may be applied to a suitable substrate in the form of free from the solvent or in the form of solution by dissolving in appropriate solvent, followed by dried to form a photosensitive plate. As the solvent, the followings are mentioned: methyl ethyl ketone, cyclohexane, butyl acetate, amyl acetate, ethyl propionate, toluene, xylene, monochlorobenzene, carbon tetrachloride, trichloroethylene, trichloroethane, dimethylformamide, methyl cellosolve, ethyl cellosolve, tetrahydrofuran, pentoxon(4-methyl-4-methoxy-2-pentanone), etc.

The substrate applied with the present composition to form the photosensitive plate includes metal or alloy sheet of aluminum, magnesium, copper, zinc, chromium, nickel, ion and so on, paper sheet such as wood free paper, art paper or exfoliable paper, inorganic sheet of glass or ceramics and polymer sheet of polyethylene terephthalate, polyethylene, polymethyl methacrylate, polyvinyl chloride, a copolymer of vinyl chloride and vinylidene chloride, polystyrene, 6-nylon, cellulose triacetate or cellulose acetate butylate.

For preventing the decrease of the sensitivity and stability in storage due to the oxygen in the atmosphere, the photosensitive layer of the photopolymerizable composition of the invention may be overlaid with a detachable transparent cover sheet or coat layer of waxy material or water-soluble polymer which has low oxygen-permeability.

For exposing the photopolymerizable composition of the invention, a light source which can irradiate ultraviolet rays of more than 180 nm in wave length, such as carbon arc, high pressure mercury lamp, xenon lamp, metal halide lamp, fluorescent lamp and uv argon ion laser may be employed preferably.

The utility of the photopolymerizable composition according to the invention is very wide and it may be applicable to, for instance, the production of lithographic printing plate and relief printing plate, photoresist for printed circuit, IC and LSI, dry film, the image formation such as relief image and duplicated image, photocurable ink, paint and adhesive.

The present invention will be more specifically described with the aid of the following specific, but non-limiting examples.

EXAMPLES 1 to 17 and COMPARATIVE EXAMPLES 1 to 4

Five grams of copolymer of methyl methacrylate and methacrylic acid, which was obtained by hydrolysing polymethyl methacrylate (trade name BR-83 manufactured by Mitsubishi Rayon Co., Ltd.) by 15 molar % in accordance with the known method, 5 g of trimethylolpropane triacrylate (manufactured by Osaka Organic Chemicals Corporation), 30 mg of Victoria pure blue-BOH (trade name; manufactured by HODOGAYA CHEMICAL CO., LTD.) and 30 mg of p-methoxyphenol were dissolved in 90 g of methyl ethyl ketone solvent to obtain a photosensitive original solution. The photopolymerization initiator shown in Table 1 below was added and dissolved to the original solution in the proportion shown in same Table 1. The resultant photosensitive solution was applied by means of whirler to a grained and anodized aluminum sheet and dried at 80° C. for 5 min to obtain a dry film of 2.0 μm in thickness. Then, an overcoat, a dried layer of 1.0 μm in thickness, was provided on the photosensitive layer by applying an aqueous solution of polyvinyl alcohol (trade name GL-05 manufactured by The Nippon Synthetic Chemical Industry Co., Ltd.).

The photosensitive plate thus produced was then exposed to the actinic light and developed with an aqueous solution of 9% by weight of butyl cellosolve and 1% by weight of sodium silicate. The sensitivity of each photosensitive composition was determined by measuring the minimum energy required to form a hard image. The results were shown in Table 1.

In Table 1, Relative Sensitivity A was measured after exposing by means of a high pressure mercuuly lamp (UMH-3000 manufactured by Ushio Electric Co., Ltd.) which irradiates multiline of 366, 405 and 436 nm, and calculated as a relative value based on the sensitivity measured in Comparative Example 1 wherein the photopolymerizable composition contains benzophenone and Michler's ketone as the initiator. Relative Sensitivity B was measured after exposing by means of a spectral irradiator (RM-23 manufactured by Narumi Corporation) which irradiates a monochromatic light of 366 nm, and calculated as a relative value based on the sensitivity measured in Comparative Example 1. The abbreviations in the column of the photopolymerization initiator of Table 1 are those described hereinbefore, and the proportion of each compound (a), (b) or (c) is % by weight based on the dry content of the photosensitive original solution.

TABLE 1

| | Photopolymerization Initiator | | | Relative Sensitivity A | Relative Sensitivity B |
|---|---|---|---|---|---|
| | Compound (a) (Proportion) | Compound (b) (Proportion) | Compound (c) (Proportion) | | |
| Example 1 | a-1(2.5%) | b-1(5%) | — | 1.4 | 1.5 |
| Example 2 | a-2(2.5%) | b-1(5%) | — | 1.4 | 1.3 |
| Example 3 | a-3(2.5%) | b-1(5%) | — | 1.7 | 1.4 |
| Example 4 | a-4(2.5%) | b-1(5%) | — | 1.4 | 1.2 |
| Example 5 | a-5(2.5%) | b-1(5%) | — | 2.0 | 1.9 |
| Example 6 | a-1(2.5%) | b-1(5%) | c-1(3%) | 5.6 | 8.4 |
| Example 7 | a-2(2.5%) | b-1(5%) | c-1(3%) | 5.6 | 8.1 |
| Example 8 | a-3(2.5%) | b-1(5%) | c-1(3%) | 8.0 | 10.1 |
| Example 9 | a-4(2.5%) | b-1(5%) | c-1(3%) | 5.6 | 7.8 |
| Example 10 | a-5(2.5%) | b-1(5%) | c-1(3%) | 8.0 | 9.5 |
| Example 11 | a-6(2.5%) | b-1(5%) | c-1(3%) | 2.0 | 2.5 |
| Example 12 | a-7(2.5%) | b-1(5%) | c-1(3%) | 1.7 | 1.9 |
| Example 13 | a-8(2.5%) | b-1(5%) | c-1(3%) | 4.0 | 5.0 |
| Example 14 | a-1(2.5%) | b-1(5%) | c-2(3%) | 5.6 | 8.2 |
| Example 15 | a-1(2.5%) | b-1(5%) | c-3(3%) | 5.6 | 7.9 |
| Example 16 | a-1(2.5%) | b-2(5%) | c-1(3%) | 5.6 | 8.1 |
| Example 17 | a-5(2.5%) | b-2(5%) | c-1(3%) | 8.0 | 9.7 |
| Comparative Example 1 | Michler's ketone (2.5%) | Benzophenone (5%) | — | 1.0 | 1.0 |
| Comparative Example 2 | a-1(2.5) | — | — | 0.01 | <0.01 |
| Comparative Example 3 | — | b-1(5%) | — | 0.05 | 0.1 |
| Comparative Example 4 | — | — | c-1(3%) | <0.01 | <0.01 |

EXAMPLES 18 to 24 and COMPARATIVE EXAMPLE 5

The photosensitive plates shown in Table 2 below were heated in an oven at 55° C. for 150 hours. Then the sensitivity was determined in accordance with the method measuring the Relative Sensitivity A in Example 1. The deviation from the initial sensitivity before the heat treatment was calculated, and the results were shown in Table 2 below.

TABLE 2

| | Photosensitive Plate | Deviation |
|---|---|---|
| Example 18 | Example 1 | 19% |
| Example 19 | Example 3 | <10% |
| Example 20 | Example 6 | <10% |
| Example 21 | Example 8 | <10% |
| Example 22 | Example 11 | 41% |
| Example 23 | Example 12 | 19% |
| Example 24 | Example 13 | <10% |
| Comparative Example 5 | Comparative Example 1 | 68% |

EXAMPLE 25

Into 1.8 liters of ethyl cellosolve, 90 g of polymer obtained by the addition reaction of pentaerythritol triacrylate to the partial alcoholysis product of copolymer of styrene/maleic acid anhydride (styright CM-2L manufactured by Sankyo Chemical Co., Ltd.), 10 g of partial hydrolysed product of polymethyl methacrylate and 100 g of trimethylolpropane triacrylate were dissolved followed by adding the initiator of 2 g of compound a-1, 16 g of compound b-1 and 6 g of compound c-1 and 1.5 g of the coloring agent of Victoria pure blue to prepare the photosensitive solution. The photosensitive plate was produced from the solution thus prepared in accordance with the same procedures as in Example 1.

The photosensitive plate was imagewise exposed through an original image on lith film and a step tablet by means of the same light source of multiline light as in Example 1 with the intensity of 0.3 mJ/cm². Developing with an aqueous solution containing 1% by weight of sodium silicate, an excellent image of hardness degree of step number 5 was obtained.

When printing was carried out with this printing plate thus produced, 100,000 copies were obtained without any deficiency. Even after 100,000 copies, the image on the printing plate has no abnormal feature.

What is claimed is:

1. A photopolymerizable composition comprising an addition-polymerizable compound having at least one ethylenically unsaturated double bond and a photopolymerization initiator, characterized in that the said initiator comprises;

(a) a compound represented by the general formula:

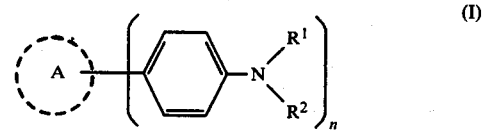

(I)

wherein $R^1$ and $R^2$ are an alkyl group, respectively, n is an integer of 1, 2 or 3 and ring A is an aromatic ring containing a nitrogen atom, and (b) hexaarylbiimidazole.

2. A photopolymerizable composition as set forth in claim 1, in which said initiator additionally contains a thiol represented by the formula:

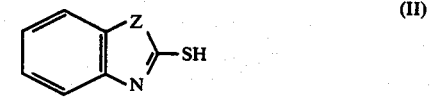

(II)

wherein Z is —O—, —S— or —NH—.

3. A photopolymerizable composition as set forth in claim 1, in which said addition-polymerizable compound having at least one ethylenically unsaturated double bond is acrylate or methacrylate 4. A photopolymerizable composition as set forth in claim 1, in which said compound of the general formula (I) is 2-(p-dialkylaminophenyl)benzoxazole, 2-(p-dialkylaminophenyl)benzo[4,5]benzoxazole or 2,5-bis(p-dialkylaminophenyl)-1,3,4-oxadiazole.

5. A photopolymerizable composition as set forth in claim 1, in which said hexaarylbiimidazole is 2,2'-bis(o-chlorophenyl)-4,4',5,5'-tetraphenylbiimidazole or 2,2'-bis(o-bromophenyl)-4,4',5,5'-tetraphenylbiimidazole.

* * * * *